(12) United States Patent
Chang

(10) Patent No.: US 7,195,506 B1
(45) Date of Patent: Mar. 27, 2007

(54) FIXING STRUCTURE FOR EXTERNAL CIRCUIT BOARD

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/393,520

(22) Filed: Mar. 29, 2006

(30) Foreign Application Priority Data

Nov. 17, 2005 (TW) .............................. 94219896 U

(51) Int. Cl.
*H01R 13/62* (2006.01)
(52) U.S. Cl. ....................................................... 439/327
(58) Field of Classification Search ................ 439/327, 439/328, 65, 325; 361/759, 801
See application file for complete search history.

(56) References Cited

U.S. PATENT DOCUMENTS 2,825,037 A * 2/1958 French ......................... 439/65

5,980,295 A * 11/1999 Lai et al. ..................... 439/327

\* cited by examiner

*Primary Examiner*—Javaid H. Nasri
(74) *Attorney, Agent, or Firm*—Fulbright & Jaworski L.L.P.

(57) ABSTRACT

A fixing structure for an external circuit board is provided for fixing the external circuit board to a carrier board, the carrier board having a first opening, and the external circuit board having a second opening corresponding to the first opening. The fixing structure includes a connecting member and a cantilever extended from one end of the connecting member. When the external circuit board is vertically inserted in a connector of the carrier board, the connecting member is coupled to the first opening of the carrier board and the cantilever is coupled to the second opening of the external circuit board, such that connection between the external circuit board and the carrier board can be enhanced by means of the fixing structure to avoid the external circuit board falling off from the carrier board by shocks.

7 Claims, 3 Drawing Sheets

FIXING STRUCTURE FOR EXTERNAL
CIRCUIT BOARD

FIELD OF THE INVENTION

The present invention relates to fixing structures, and more particularly, to a fixing structure for an external circuit board.

BACKGROUND OF THE INVENTION

As the technology advances, various electronic products especially high-level servers and personal computers have been developed in accordance with demands of manufacturers and consumers.

Under a condition of requiring multiple functions provided by an electronic device, a single circuit board installed in the electronic device cannot meet such requirement. Accordingly, an external circuit board is considered necessary to be used with the inherent circuit board to form a modularized structure to provide the electronic device with enhanced electrical and functional performances.

FIG. 1 shows a conventional structure having an external circuit board additionally mounted to an inherent circuit board. A connector 120 is additionally formed on a printed circuit board 100 where various electronic components (including active components and passive components) are mounted, such that an external circuit board 110 can be vertically inserted in the connector 120 by gold fingers 112 formed on a side of the external circuit board 110, and can be electrically connected to the printed board 100 by the connector 120.

However, as the above external circuit board 110 is connected to the printed circuited board 100 only by inserting the gold fingers 112 in the connector 120, the connection between the external circuit board 110 and the printed circuit board 100 is not good enough, and the external circuit board 110 may easily fall off from the printed circuit board 100 due to external shocks.

Therefore, the problem to be solved here is to provide a fixing structure for an external circuit board to avoid the external circuit board falling from a carrier board, on which the external circuit board is mounted, due to external shocks.

SUMMARY OF THE INVENTION

In light of the above drawback of the prior art, a primary objective of the present invention is to provide a fixing structure for an external circuit board, for effectively fixing the external circuit board on an inherent circuit board of an electronic device.

Another objective of the present invention is to provide a fixing structure for an external circuit board, for avoiding the external circuit board falling off from an inherent circuit board of an electronic device due to external shocks.

A further objective of the present invention is to provide a fixing structure for an external circuit board, which is simple in structure and is convenient in assembly and operation.

To achieve the above-mentioned and other objectives, the present invention proposes a fixing structure for an external circuit board, for fixing the external circuit board to a carrier board, the carrier board having a first opening, and the external circuit board having a second opening corresponding to the first opening. The fixing structure comprises a connecting member; and a cantilever extended from one end of the connecting member, allowing the connecting member to be coupled to the first opening of the carrier board and the cantilever to be coupled to the second opening of the external circuit board provided that the external circuit board is vertically mounted via a side thereof to the carrier board, so as to enhance connection between the external circuit board and the carrier board and avoid the external circuit board falling off from the carrier board due to shocks.

The connecting member of the fixing structure comprises a base, a fixing pin for the base, and a connecting portion formed between the base and the fixing pin. The connecting member is made of an elastic material. By a design that cross-section sizes of the base and the fixing pin of the connecting member are larger than that of the first opening of the carrier board and a cross-section size of the connecting portion of the connecting member is smaller than that of the first opening of the carrier board, when one end of the fixing pin of the connecting member is inserted in the first opening of the carrier board, the connecting portion of the connecting member can be received and fixed in the first opening, and the cantilever disposed on the end of the connecting member can be inserted in the second opening of the external circuit board that is vertically mounted to the carrier board, so as to provide a good connection effect between the external circuit board and the carrier board by means of the fixing structure.

Therefore, the fixing structure for an external circuit board according to the present invention has the connecting member coupled to the first opening of the carrier board, and allows the cantilever disposed on the end the connecting member to be coupled to the second opening of the external circuit board that is vertically inserted in the carrier board, such that the external circuit board can be effectively fixed to the carrier board and prevented from falling off from the carrier board due to external shocks. Moreover, the fixing structure of the present invention is simple in structure and is convenient in assembly and operation, thereby overcoming the drawbacks of the prior art.

BRIEF DESCRIPTIONS OF THE DRAWINGS

The present invention can be more fully understood by reading the following detailed description of the preferred embodiments, with reference made to the accompanying drawings, wherein.

DETAILED DESCRIPTIONS OF THE PREFERRED EMBODIMENTS

Preferred embodiments of a fixing structure for an external circuit board according to the present invention are described as follows with reference to FIGS. 2 and 3. It is to be noted that the drawings are simplified schematic diagrams and only show components relating to the present invention. In practice, the layout of components could be more complicated. It should be understood that the following embodiments are not construed to limit the scope of the present invention.

Figure 1:
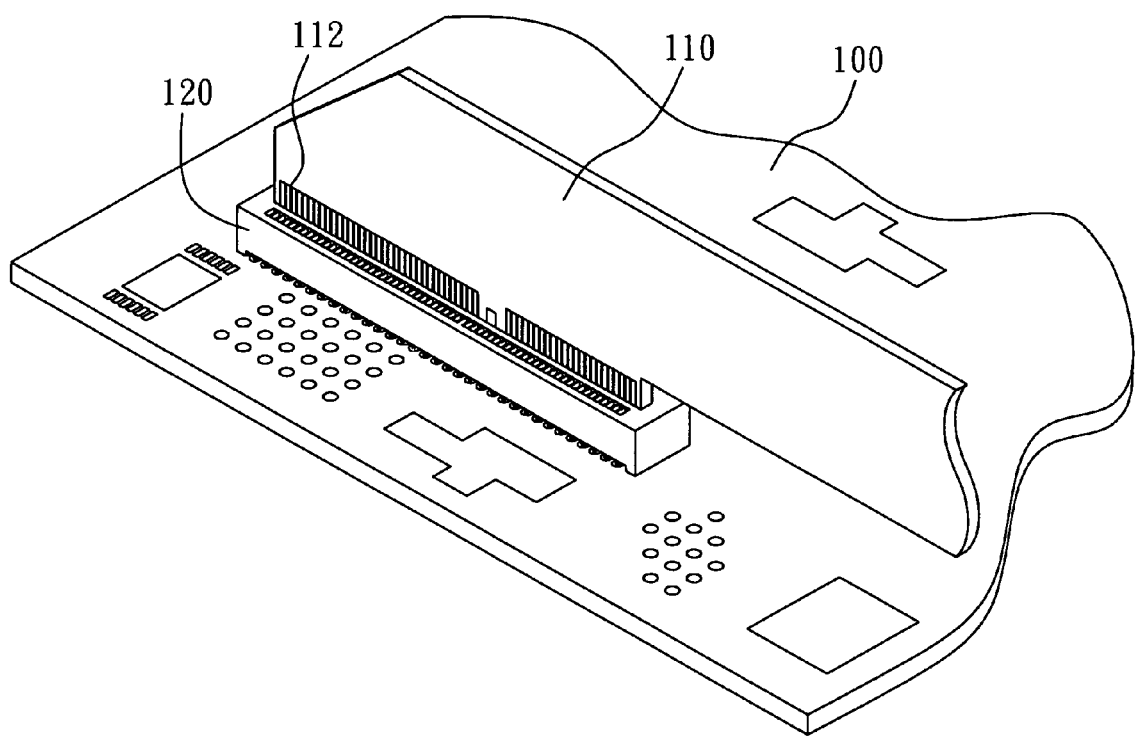
FIG. 1 (PRIOR ART) is a schematic diagram showing a structure of an external circuit board additionally provided on a conventional circuit board.
Figure 2:
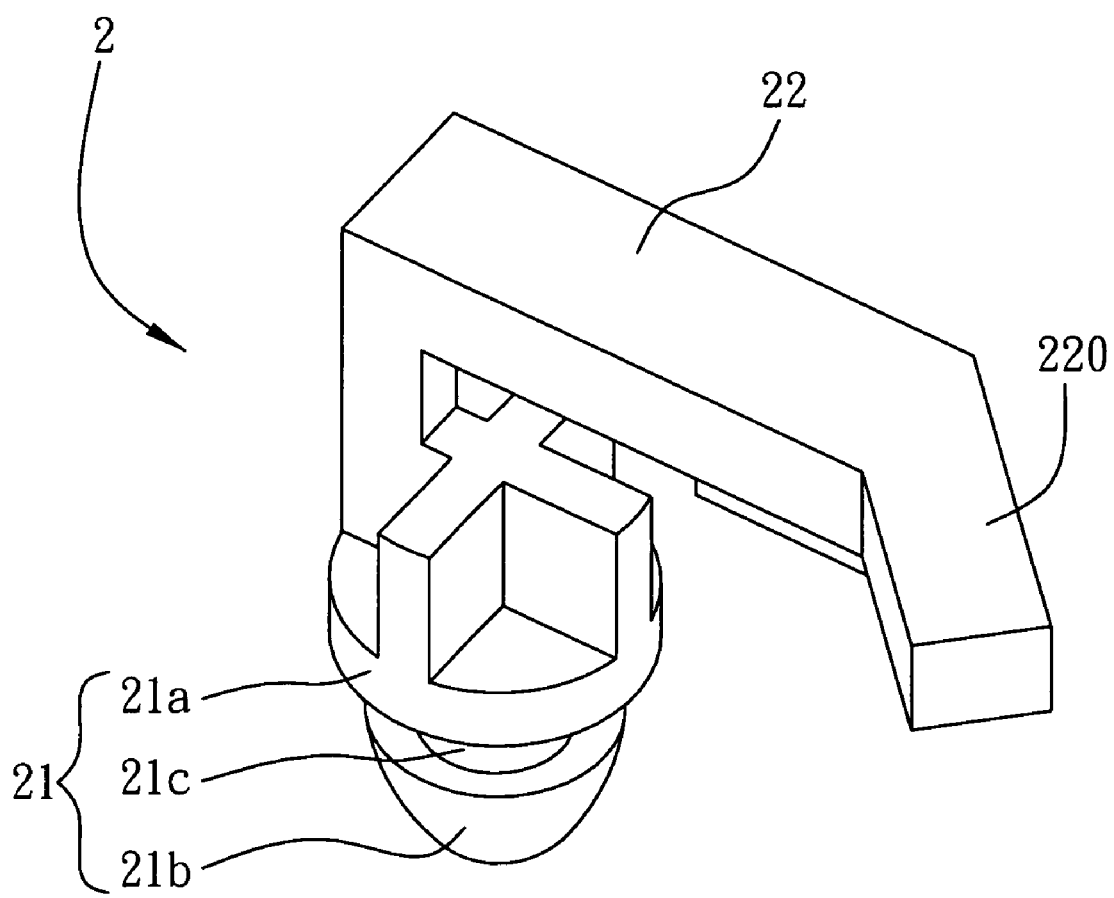
FIG. 2 is a schematic diagram showing a fixing structure for an external circuit board according to the present invention.

As shown in FIG. 2, a fixing structure 2 for an external circuit board according to the present invention comprises: a connecting member 21, and a cantilever 22 extended from one end of the connecting member 21.

The connecting member 21 comprises: a base 21a, a fixing pin 21b for the base 21a, and a connecting portion 21c formed between the base 21a and the fixing pin 21b. A cross-sectional size of the connecting portion 21c is smaller than those of the base 21a and the fixing pin 21b. The connecting member 21 is made of an elastic material (such as plastic), for being coupled to a carrier board (such as an inherent circuit board) preformed with an opening.

The cantilever 22 is vertically extended from the base 21a of the connecting member 21, and a bending portion 220 is further formed at one end of the cantilever 22 to be effectively fastened to the external circuit board.

Figure 3:
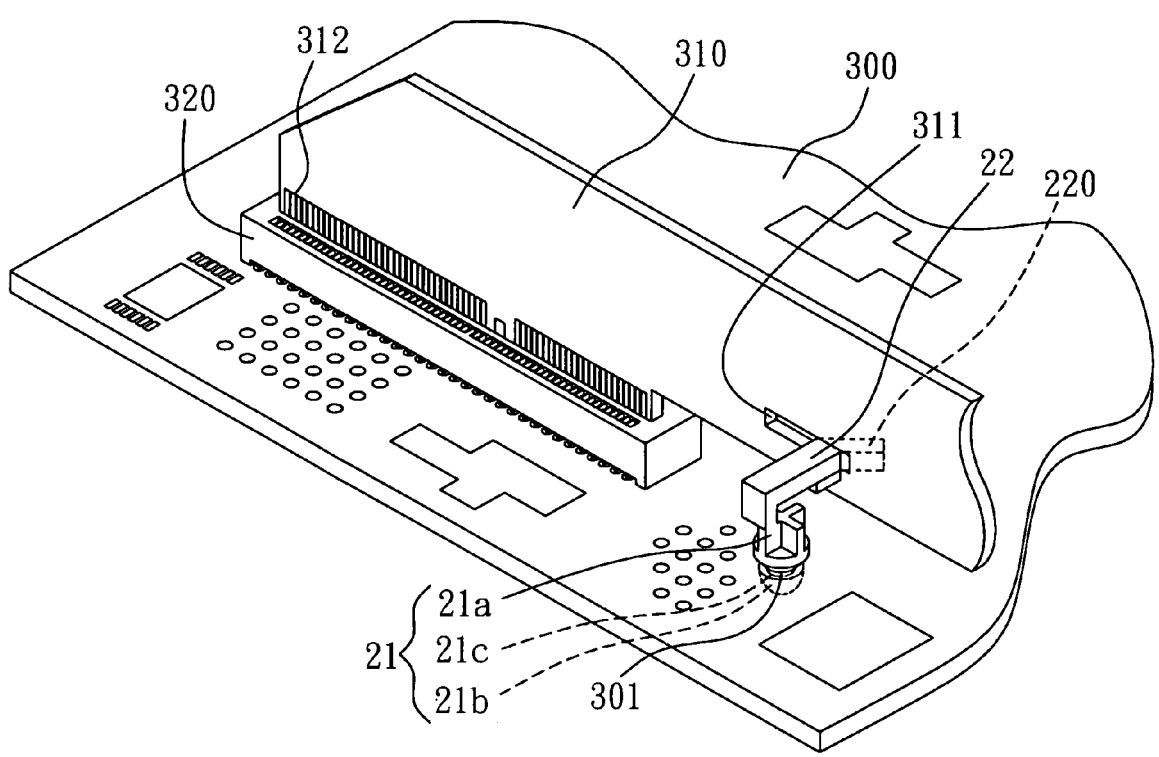
FIG. 3 is a schematic diagram showing an external circuit board fixed to a carrier board through the use of the fixing structure shown in FIG. 2.

As shown in FIG. 3, in practical implementation, an external circuit board 310 is prepared for electrical and functional expansion for a carrier board such as a printed circuit board 300 formed with various electronic components (including active components and passive components). A connector 320 is preformed on the printed circuit board 300, allowing the external circuit board 310 to be vertically inserted in the connector 320, wherein the external circuit board 310 has electrical connection terminals (such as gold fingers 312) on a side thereof being vertically coupled to the connector 320, such that the external circuit board 310 is electrically connected to the printed circuit board 300 by the connector 320. Moreover, a first opening 301 and a second opening 311 are respectively formed in the printed circuit board 300 and the external circuit board 310.

During operation, by a design that the cross-sectional sizes of the base 21a and the fixing pin 21b of the connecting member 21 are larger than that of the first opening 301 of the printed circuit board 300 and the cross-sectional size of the connecting portion 21c of the connecting member 21 is smaller than that of the first opening 301, with one end of the fixing pin 21b of the connecting member 21 being inserted in the first opening 301 of the printed circuit board 300, the connecting portion 21c of the connecting member 21 can be received and fixed in the first opening 301, such that the connecting member 21 can rotate freely on the printed circuit board 300. Furthermore, the cantilever 22 disposed on the end of the connecting member 21 can be correspondingly coupled to the second opening 311 of the external circuit board 310 that is vertically inserted in the printed circuit board 300, and the bending portion 220 at the end of the cantilever 22 can be effectively fastened to the external circuit board 310, such that a good connection effect between the external circuit board 310 and the printed circuit board 300 is achieved by the fixing structure 2, thereby enhancing the connection between the external circuit board 310 and the printed circuit board 300 and avoiding the external circuit board 310 falling off from the printed circuit board 300 due to shocks.

Therefore, the fixing structure for an external circuit board according to the present invention has the connecting member coupled to the first opening of the carrier board, and allows the cantilever disposed on the end the connecting member to be coupled to the second opening of the external circuit board that is vertically inserted in the carrier board, such that the external circuit board can be effectively fixed to the carrier board and prevented from falling off from the carrier board due to external shocks. Moreover, the fixing structure of the present invention is simple in structure and is convenient in assembly and operation, thereby overcoming the drawbacks of the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fixing structure for an external circuit board, for fixing the external circuit board to a carrier board, the carrier board having a first opening, and the external circuit board having a second opening corresponding to the first opening, the fixing structure comprising:

a connecting member comprising a base, a fixing pin for the base, and a connecting portion formed between the base and the fixing pin, for allowing one end of the fixing pin of the connecting member to be inserted in the first opening of the carrier board; and a cantilever extended from one end of the connecting member, allowing the connecting member to be coupled to the first opening of the carrier board and the cantilever to be coupled to the second opening of the external circuit board provided that the external circuit board is vertically mounted via a side thereof to the carrier board, so as to enhance connection between the external circuit board and the carrier board.

2. The fixing structure of claim 1, wherein cross-sectional sizes of the base and the fixing pin of the connecting member are larger than that of the first opening of the carrier board, and a cross-sectional size of the connecting portion of the connecting member is smaller than that of the first opening.

3. The fixing structure of claim 2, wherein with the end of the fixing pin of the connecting member being inserted in the first opening of the carrier board, the connecting portion of the connecting member is received and fixed in the first opening, so as to allow the connecting member to rotate on the carrier board.

4. The fixing structure of claim 1, wherein the connecting member is made of an elastic material.

5. The fixing structure of claim 1, wherein the cantilever is formed with a bending portion at one end thereof for being fastened to the external circuit board.

6. The fixing structure of claim 1, wherein the carrier board is a printed circuit board, for allowing electrical connection terminals of the side of the external circuit board to be vertically inserted in a predetermined connector formed on the printed circuit board.

7. The fixing structure of claim 6, wherein the electrical connection terminals of the external circuit board are gold fingers.

* * * * *